US008530262B2

(12) United States Patent
Van Duren et al.

(10) Patent No.: US 8,530,262 B2
(45) Date of Patent: Sep. 10, 2013

(54) ROLL-TO-ROLL NON-VACUUM DEPOSITION OF TRANSPARENT CONDUCTIVE ELECTRODES

(75) Inventors: Jeroen K. J. Van Duren, San Francisco, CA (US); Matthew R. Robinson, San Jose, CA (US); James R. Sheats, Palo Alto, CA (US)

(73) Assignee: Nanosolar, Inc., San Jose, CA (US)

( * ) Notice: Subject to any disclaimer, the term of this patent is extended or adjusted under 35 U.S.C. 154(b) by 0 days.

(21) Appl. No.: 12/396,435

(22) Filed: Mar. 2, 2009

(65) Prior Publication Data

US 2010/0003781 A1 Jan. 7, 2010

Related U.S. Application Data

(60) Provisional application No. 61/032,425, filed on Feb. 28, 2008.

(51) Int. Cl.
*H01L 21/00* (2006.01)

(52) U.S. Cl.
USPC .............................................. 438/57; 438/95

(58) Field of Classification Search
None
See application file for complete search history.

(56) References Cited

U.S. PATENT DOCUMENTS

| 4,189,200 A | 2/1980 | Yeager et al. |
| 4,630,874 A | 12/1986 | Renn et al. |
| 5,458,506 A | 10/1995 | Yamaguchi et al. |
| 5,709,573 A | 1/1998 | McClure |
| 5,953,815 A | 9/1999 | Kaminski et al. |
| 5,954,521 A | 9/1999 | Yang |
| 6,099,346 A | 8/2000 | Hashiguchi et al. |
| 6,123,558 A | 9/2000 | Shibata |
| 6,126,472 A | 10/2000 | Choy |
| 6,162,083 A | 12/2000 | Seto |

(Continued)

FOREIGN PATENT DOCUMENTS

| CN | 1549400 A | 11/2004 |
| EP | 0 933 837 A1 | 5/2002 |

(Continued)

OTHER PUBLICATIONS

Kapur, Bansal, Omar and Asensio, "Non-vacuum processing of CuIn1—xGaxSe2 solar cells on rigid and flexible substrates using nanoparticle precursor inks," 2003, Thin Solid Films, 431-432, pp. 53-57.*

(Continued)

*Primary Examiner* — Michael Lebentritt
*Assistant Examiner* — Aaron Dehne
(74) *Attorney, Agent, or Firm* — Joshua D. Isenberg; JDI Patent (57) ABSTRACT

Methods and devices are provided for improved photovoltaic devices. Non-vacuum deposition of transparent conductive electrodes in a roll-to-roll manufacturing environment is disclosed. In one embodiment, a method is provided for forming a photovoltaic device. The method comprises processing a precursor layer in one or more steps to form a photovoltaic absorber layer; depositing a smoothing layer to fill gaps and depression in the absorber layer to reduce a roughness of the absorber layer; adding an insulating layer over the smooth layer; and forming a web-like layer of conductive material over the insulating layer. By way of nonlimiting example, the web-like layer of conductive material comprises a plurality of carbon nanotubes. In some embodiments, the absorber layer is a group IB-IIIA-VIA absorber layer.

13 Claims, 5 Drawing Sheets

(56) References Cited

U.S. PATENT DOCUMENTS

| | | |
|---|---|---|
| 6,176,737 B1 | 1/2001 | Choy |
| 6,203,345 B1 | 3/2001 | Roque et al. |
| 6,210,174 B1 | 4/2001 | Pei et al. |
| 6,210,209 B1 | 4/2001 | Wu et al. |
| 6,261,106 B1 | 7/2001 | Tung |
| 6,383,017 B1 | 5/2002 | Takayasu |
| 6,431,897 B1 | 8/2002 | Hashiguchi et al. |
| 6,506,074 B2 | 1/2003 | Hashimoto |
| 6,676,444 B2 | 1/2004 | Noro |
| 6,755,682 B2 | 6/2004 | Kunishi et al. |
| 6,767,233 B2 | 7/2004 | Tsunematsu |
| 6,790,074 B1 | 9/2004 | Chiu |
| 6,851,968 B2 | 2/2005 | Tsunematsu |
| 6,855,009 B2 | 2/2005 | Nishiyama |
| 6,863,559 B2 | 3/2005 | Yu |
| 6,869,307 B2 | 3/2005 | Endo |
| 6,921,274 B2 | 7/2005 | Yu |
| 6,971,908 B2 | 12/2005 | Shiu et al. |
| 7,101,188 B1 | 9/2006 | Summers et al. |
| 7,140,909 B2 | 11/2006 | Moritake |
| 7,189,105 B2 | 3/2007 | Takaku et al. |
| 7,273,381 B2 | 9/2007 | Ito |
| 7,297,020 B2 | 11/2007 | Takahira |
| 2002/0119704 A1 | 8/2002 | Ito et al. |
| 2003/0092310 A1 | 5/2003 | Kunishi et al. |
| 2004/0187917 A1* | 9/2004 | Pichler ............... 136/263 |
| 2005/0075004 A1 | 4/2005 | Endou et al. |
| 2005/0236032 A1* | 10/2005 | Aoki ................. 136/252 |
| 2005/0238804 A1* | 10/2005 | Garbar et al. ........... 427/180 |
| 2006/0172590 A1 | 8/2006 | Yamada et al. |
| 2006/0189175 A1 | 8/2006 | Kinsley |
| 2007/0054545 A1 | 3/2007 | Takahira |
| 2007/0079869 A1* | 4/2007 | Yukinobu .............. 136/263 |
| 2007/0163637 A1* | 7/2007 | Robinson et al. ........ 136/262 |
| 2007/0169812 A1* | 7/2007 | Robinson et al. ........ 136/262 |
| 2008/0023066 A1* | 1/2008 | Hecht et al. ........... 136/256 |

FOREIGN PATENT DOCUMENTS

| | | | |
|---|---|---|---|
| JP | 59-110990 U | | 7/1984 |
| JP | 63-83779 U | | 6/1988 |
| JP | 07-057825 | | 3/1995 |
| JP | 8-148222 A | | 6/1996 |
| JP | 08-306446 | | 11/1996 |
| JP | 09-293571 | | 11/1997 |
| JP | 11-121108 | | 4/1999 |
| JP | 2000-251024 | | 9/2000 |
| JP | 2000-251025 | | 9/2000 |
| JP | 2002134878 A | * | 5/2002 |
| JP | 2002-270261 A | | 9/2002 |
| JP | 03-425696 | | 5/2003 |
| JP | 2003-272774 | | 9/2003 |

OTHER PUBLICATIONS

Ottosson, "The role of i-ZnO for shunt prevention in Cu(In,Ga)Se2-based solar cells", 2006, Uppsala University.*

Chinese Office Action and English Translation for Chinese Patent Application No. 2004100807089, dated Mar. 10, 2006.

Office Action dated Feb. 15, 2008 for Chinese Patent Application No. 2006-10151635.7.

Official Notice from Japanese Patent Office for Japanese Patent Application No. 2002-098965.

Official Notice of Rejection of Japanese Patent Office for Japanese Patent Application No. 2004-239954, dated Oct. 16, 2007.

\* cited by examiner

ROLL-TO-ROLL NON-VACUUM DEPOSITION OF TRANSPARENT CONDUCTIVE ELECTRODES

CROSS-REFERENCE TO RELATED APPLICATION

The present application claims the benefit of priority to U.S. Provisional Patent Application Ser. No. 61032425 filed Feb. 28, 2008 and fully incorporated herein by reference for all purposes.

FIELD OF THE INVENTION

The present invention is directed to non-vacuum depositing transparent conductive electrodes (TCE) on large area substrates and more specifically to non-vacuum TCE deposition in high-throughput roll-to-roll production systems for use in photovoltaics.

BACKGROUND OF THE INVENTION

Solar cells and solar modules convert sunlight into electricity. These electronic devices have been traditionally fabricated using silicon (Si) as a light-absorbing, semiconducting material in a relatively expensive production process. To make solar cells more economically viable, solar cell device architectures have been developed that can inexpensively make use of thin-film, light-absorbing semiconductor materials such as copper-indium-gallium-selenide (CIGS) and the resulting devices are often referred to as CIGS solar cells.

A central challenge in cost-effectively constructing a large-area CIGS-based solar cell or module involves reducing processing costs and material costs. In known versions of CIGS solar cells, the transparent electrode layer and many other layers are deposited by a vacuum-based process over a rigid glass substrate. Typical deposition techniques include co-evaporation, sputtering, chemical vapor deposition, or the like. The nature of vacuum deposition processes requires equipment that is generally low throughput and expensive. Vacuum deposition processes are also typically carried out at high temperatures and for extended times. Traditional sputtering or co-evaporation techniques are limited to line-of-sight and limited-area sources, tending to result in poor surface coverage and non-uniform three-dimensional distribution of the elements.

High-efficiency thin-film solar cells based on polycrystalline CIGS (copper indium gallium di-selenide, but not excluding any other of the IB, IIIA, VIA elements like e.g. aluminum, and sulfur) are typically made with a transparent conductive oxide (TCO) deposited on top of a stack containing the CIGSe film, where depending on interconnect scheme some require additional conductive patterns (traces, fingers, grids, lines, bus bars, etc.) to collect the current with minimal electrical-resistive and optical-shadowing losses. Lowering the cost of the deposition of these transparent conductive layers and conductive patterns is required to minimize the overall cost of the solar panels.

One of the most common techniques used to roll-to-roll deposit transparent conductive electrodes (TCE) is sputter deposition of transparent conductive oxides (TCO). Unfortunately, for the film thickness and high vacuum required, sputter deposition is a slow process with an undesired low throughput/capex ratio. In addition, material yield is low due to deposition of material onto the chamber walls. Furthermore, temperature control during sputter deposition can limit the throughput even further, especially when damage of underlying temperature-sensitive layers, like e.g. the CIGSe/CdS stack, needs to be prevented. Finally, controlling the large-area uniformity of both the conductivity and transparency of a sputter-deposited TCO is challenging.

In an attempt to lower manufacturing cost, solution-deposition of transparent conductive layers has been investigated by others. One example uses high-temperature sintering of solution-deposited metal oxide particles and subsequently these particles are sintered to a dense layer. A huge disadvantage of this method is the temperature required to get dense layers. Temperatures required to sinter these layers damage the underlying films as used in thin-film PV.

Other examples use individually grown carbon nanotubes or metallic nanowires that are solution-deposited and where the layer is mechanically stabilized by organic additives allowing processing at temperatures that prevent damage to the underlying layers. One big disadvantage of this approach is the limited lateral electrical conductivity that can be accomplished without loosing too much optical transparency. Additionally, since the amount of organics required to mechanically stabilize these layers is considerable, a bi-continuous percolating conductive network inside an electrically-insulating network is created. The two-phase nature of this approach limits the contact area that can be achieved at both interfaces when sandwiched between other (semi)conductive layers. This limited contact area affects the contact resistance in a negative way. Additionally, a possible mismatch in the coefficients of thermal expansion of both the conductive and insulating materials might impact the temperature dependence and reliability of the overall conductivity of the bi-continuous network in a negative way.

A third approach mixes organic nanotubes with doped conjugated polymers to increase the lateral conductivity compared to nanotubes only. Typically, the chemical stability of organic materials is photosensitive and the conductivity is smaller than of inorganic materials.

Summarizing, the major challenges to uniformly deposit a highly-conductive, highly-transparent (for AM1.0 or AM1.5), chemically-stable, reliable thin layer onto a large area without use of vacuum and high temperature.

Due to the aforementioned issues, improved techniques may be used for reducing processing costs and material costs. Improvements may be made to increase the throughput of existing manufacturing processes and decrease the cost associated with CIGS based solar devices. The decreased cost and increased production throughput should increase market penetration and commercial adoption of such products.

SUMMARY OF THE INVENTION

Embodiments of the present invention address at least some of the drawbacks set forth above. It should be understood that at least some embodiments of the present invention may be applicable to any type of solar cell, whether they are rigid or flexible in nature or the type of material used in the absorber layer. Embodiments of the present invention may be adaptable for roll-to-roll and/or batch manufacturing processes. In one embodiment, low cost transparent conductor (TC) is provided that will work on printed & rapid thermally processed CIGS, CIGSS, or other absorber layer to reduce or eliminate the amount of material that needs to be sputtered or chemical vapor deposited. At least some of these and other objectives described herein will be met by various embodiments of the present invention.

Embodiments of the present invention may address the challenges involved fabricating such transparent conductive electrodes in a cost-effective manner. In one embodiment, a thin, transparent, conductive sheet or roll is transferred from a sacrificial material to a partially completed solar cell stack via standard transfer (adhesion and release) technology. The thin, transparent, conductive sheet or roll might consist of high-temperature, sintered, transparent, conductive oxide particles, and the sacrificial material might be aluminum foil. The transparent conductive sheet or roll might also consist of block copolymers filled with conductive material. The block copolymers have been solution-deposited onto a sacrificial material, followed by filling the pores with conductive material. This conductive material might be deposited into the pores of the block copolymers via electro(less) deposition Some alternatives include depositing an ultrathin layer of silver and then patterning it lithographically. Various methods of self-assembly have been described which have the potential to arrange small particles in usefully ordered arrays. In one embodiment, a solution coatable transparent conductor layer for CIGS or CIGSS solar cells is provided to simplify cell manufacturing. It should be understood that a TCE layer may in one embodiment be that taught in U.S. patent application Ser. No. 10/338,079 filed Jan. 6, 2003 and fully incorporated herein by reference for all purposes.

In one embodiment of the present invention, the transparent electrode of a thin-film CIGS solar cell is replaced in part or completely by a sheet of carbon nanotubes. This sheet might be grown by catalytic thermal chemical vapor deposition (CVD) and pulled into a dense, transparent, conductive sheet of oriented multiwall carbon nanotubes from a less dense forest of multiwall carbon nanotubes. This sheet is subsequently laminated onto the underlying layers to allow formation of a thin-film CIGS solar cell.

In another embodiment of the present invention a conductive, transparent layer is grown onto the partially completed stack of layers to form a thin-film CIGS solar cell by use of solution-deposition of block-copolymers, followed by filling the blockcopolymers with conductive material.

In yet another embodiment of the present invention graphine is used as a transparent conductive layer. Graphine is single sheet graphite. It is extremely conductive in the x-y direction and extremely transparent in the z direction due to its 2D structure. Graphine sheets can be exfoliated from graphite. One method of exfoliation is with tape. Deposition could be done with solution coating by dispersing exfoliated graphine into solution followed by coating. Deposition could also be done via transfer via standard adhesion and release layer technology. Finally another method could be to use a tape that can be permanently left on top of the solar cell.

In one embodiment of the present invention, a method is provided for forming a photovoltaic device. The method comprises processing a precursor layer in one or more steps to form a photovoltaic absorber layer; depositing a smoothing layer to fill gaps and depression in the absorber layer to reduce a roughness of the absorber layer; adding an insulating layer over the smooth layer; and forming a web-like layer of conductive material over the insulating layer. By way of nonlimiting example, the web-like layer of conductive material comprises a plurality of carbon nanotubes. In some embodiments, the absorber layer is a group IB-IIIA-VIA absorber layer.

In one embodiment of the present invention, the transparent electrode of a solar cell is replaced in part by a carbon nanotubes coating that is less than one monolayer of tubes. In this embodiment, to address any roughness of underlying CIGS/ZnO(i), thicker insulator (either i-ZnO or other material) may be used. One can imagine that the ZnO(i) would not be able to completely cover the rough CIGS or CIGSS surface and that these tubes can find their way anywhere and seem to be a continuous network of highly conducting wires. The evaporation of Ni,Al fingers will go into the CIGS layer and create a shunt since the tube network is porous and the ZnO(i) is presumably spotty. Using a thicker insulator or one of the other solutions described herein will reduce shunting in rough absorber layers using web-like transparent conductors.

In another embodiment of the present invention, the method comprises processing a precursor layer in one or more steps to form a photovoltaic absorber layer; depositing a smoothing layer to fill gaps and depression in the absorber layer to reduce a roughness of the absorber layer; adding an insulating layer over the smoothing layer; and forming a web-like layer of conductive material over the insulating layer.

In yet another embodiment of the present invention, a method comprises processing a precursor layer in one or more steps to form a photovoltaic absorber layer; and depositing a smoothing, insulating layer to fill gaps and depression in the absorber layer to reduce a roughness of the absorber layer.

It should be understood that for any of the embodiments herein, the following may optionally also apply. Optionally, the smoothing insulator is sufficient to cover all peaks of the rough absorber, but sufficiently thin to allow electrons to pass out of the absorber layer. Optionally, the smoothing insulator conformally covers all peaks in the rough absorber. Optionally, the method includes further comprising creating the absorber layer by processing the precursor layer into a solid film and then thermally reacting the solid film in an atmosphere containing at least an element of Group VIA of the Periodic Table to form the photovoltaic absorber layer. Optionally, creating the absorber layer by thermal reaction of the precursor layer in an atmosphere containing at least an element of Group VIA of the Periodic Table to form the photovoltaic absorber layer. Optionally, Group IB and/or IIIA hydroxide comprises indium-gallium hydroxide and used as a precursor material for the absorber layer. Optionally, the web material may be solution coated onto the target surface. Examples of solution deposition methods may include at least one method from the group comprising: wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink-jet printing, jet deposition, spray deposition, aerosol spray deposition, dip coating, web coating, microgravure web coating, or combinations thereof. These applications of carbon nanotubes provide new avenues to lower costs, better durability, better thermal stability, and higher efficiencies. Of course, other non-solution based techniques may also be used.

In yet another embodiment of the present invention, a method is provided comprising of processing a precursor layer in one or more steps to form a photovoltaic absorber layer; and depositing a conformal insulating layer over the gaps and depression in the absorber layer to minimize shunting due to roughness of the absorber layer.

One embodiment of the present invention uses solution-deposition followed by subsequent low-temperature processing, is to be able to formulate an ink (slurry, paste, dispersion, emulsion, paint, solution) that allows the following. (1) One single or multiple solution-deposition steps of (precursors of) conductive materials onto an underlying layer without the negative influence electrically-insulating organic additives might have on the contact resistance to the underlying layer (and overlying layer), and volume resistivity within the bulk of the transparent conductive layer. (2) Limiting the sintering time and temperature. (3) Enhancing conductivity between the individual, discrete, electrically conductive particles (rods, wires, tetrapods). (4) Minimizing the impact of the wettability of the underlying layer and the formulation of the ink on the morphology of the as-deposited ink where the morphology impacts both the contact resistance and volume resistivity. (5) Limiting the negative impact of a possible CTE-mismatch within the layer on volume resistivity with temperature and time. (6) Allowing for chemically, mechanically, and electrically stable layers for a reliable stable product. In order to overcome the difficulties with typical materials used for solution-deposition, new materials and/or methods are required.

A further understanding of the nature and advantages of the invention will become apparent by reference to the remaining portions of the specification and drawings.

DESCRIPTION OF THE SPECIFIC EMBODIMENTS

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials, reference to "a compound" may include multiple compounds, and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings:

"Optional" or "optionally" means that the subsequently described circumstance may or may not occur, so that the description includes instances where the circumstance occurs and instances where it does not. For example, if a device optionally contains a feature for an anti-reflective film, this means that the anti-reflective film feature may or may not be present, and, thus, the description includes both structures wherein a device possesses the anti-reflective film feature and structures wherein the anti-reflective film feature is not present.

Photovoltaic Device

Figure 1:
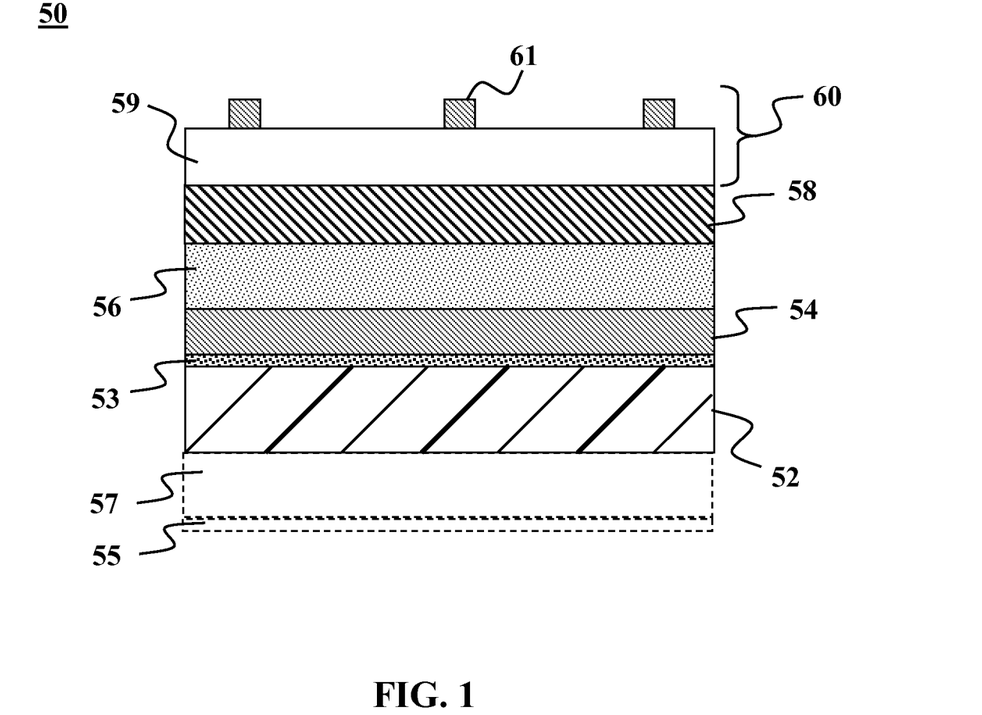
FIG. 1 shows a cross-sectional view of a photovoltaic device according to one embodiment of the present invention.

Referring now to FIG. 1, one example of a photovoltaic device is shown. The device 50 includes a base substrate 52, an optional adhesion layer 53, a base or back electrode 54, a p-type absorber layer 56, an n-type semiconductor thin film 58 and a transparent electrode 60. By way of example, the base substrate 52 may be made of a metal foil, a polymer such as polyimides (PI), polyamides, polyetheretherketone (PEEK), Polyethersulfone (PES), polyetherimide (PEI), polyethylene naphtalate (PEN), Polyester (PET), related polymers, a metallized plastic, and/or combination of the above and/or similar materials. By way of nonlimiting example, related polymers include those with similar structural and/or functional properties and/or material attributes. The base electrode 54 is made of an electrically conductive material. By way of example, the base electrode 54 may be of a metal layer whose thickness may be selected from the range of about 0.1 micron to about 25 microns. An optional intermediate layer 53 may be incorporated between the electrode 54 and the substrate 52. The transparent electrode 60 may include a transparent conductive layer 59 and a layer of metal (e.g., Al, Ag, Cu, or Ni) fingers 61 to reduce sheet resistance. Optionally, the layer 53 may be a diffusion barrier layer to prevent diffusion of material between the substrate 52 and the electrode 54. The diffusion barrier layer 53 may be a conductive layer or it may be an electrically nonconductive layer. As nonlimiting examples, the layer 53 may be composed of any of a variety of materials, including but not limited to chromium, vanadium, tungsten, and glass, or compounds such as nitrides (including tantalum nitride, tungsten nitride, titanium nitride, silicon nitride, zirconium nitride, and/or hafnium nitride), oxides, carbides, and/or any single or multiple combination of the foregoing. Although not limited to the following, the thickness of this layer can range from 10 nm to 50 nm. In some embodiments, the layer may be from 10 nm to 30 nm. Optionally, an interfacial layer may be located above the electrode 54 and be comprised of a material such as including but not limited to chromium, vanadium, tungsten, and glass, or compounds such as nitrides (including tantalum nitride, tungsten nitride, titanium nitride, silicon nitride, zirconium nitride, and/or hafnium nitride), oxides, carbides, and/or any single or multiple combination of the foregoing. The transparent conductive layer 59 may be inorganic, e.g., a transparent conductive oxide (TCO) such as but not limited to indium tin oxide (ITO), fluorinated indium tin oxide, zinc oxide (ZnO), aluminum doped zinc oxide (AZO), gallium doped zinc oxide (GZO), boron doped zinc oxide (BZO).

Aluminum and molybdenum can and often do inter-diffuse into one another, with deleterious electronic and/or optoelectronic effects on the device 50. To inhibit such inter-diffusion, an intermediate, interfacial layer 53 may be incorporated between the aluminum foil substrate 52 and molybdenum base electrode 54. The interfacial layer may be composed of any of a variety of materials, including but not limited to chromium, vanadium, tungsten, and glass, or compounds such as nitrides (including but not limited to titanium nitride, tantalum nitride, tungsten nitride, hafnium nitride, niobium nitride, zirconium nitride vanadium nitride, silicon nitride, or molybdenum nitride), oxynitrides (including but not limited to oxynitrides of Ti, Ta, V, W, Si, Zr, Nb, Hf, or Mo), oxides, and/or carbides. The material may be selected to be an electrically conductive material. In one embodiment, the materials selected from the aforementioned may be those that are electrically conductive diffusion barriers. The thickness of this layer can range from 10 nm to 50 nm or from 10 nm to 30 nm. Optionally, the thickness may be in the range of about 50 nm to about 1000 nm. Optionally, the thickness may be in the range of about 100 nm to about 750 nm. Optionally, the thickness may be in the range of about 100 nm to about 500 nm. Optionally, the thickness may be in the range of about 110 nm to about 300 nm. In one embodiment, the thickness of the layer 53 is at least 100 nm or more. In another embodiment, the thickness of the layer 53 is at least 150 nm or more. In one embodiment, the thickness of the layer 53 is at least 200 nm or more. Optionally, some embodiments may include another layer such as but not limited to an aluminum layer above the layer 53 and below the base electrode layer 54. This layer may be thicker than the layer 53. Optionally, it may be the same thickness or thinner than the layer 53. This layer 53 may be placed on one or optionally both sides of the aluminum foil (shown as layer 55 in phantom in FIG. 1).

If barrier layers are on both sides of the aluminum foil, it should be understood that the protective layers may be of the same material or they may optionally be different materials from the aforementioned materials. The bottom protective layer 55 may be any of the materials. Optionally, some embodiments may include another layer 57 such as but not limited to an aluminum layer above the layer 55 and below the aluminum foil 52. This layer 57 may be thicker than the layer 53 (or the layer 54). Optionally, it may be the same thickness or thinner than the layer 53 (or the layer 54). Although not limited to the following, this layer 57 may be comprised of one or more of the following: Mo, Cu, Ag, Al, Ta, Ni, Cr, NiCr, or steel. Some embodiments may optionally have more than one layer between the protective layer 55 and the aluminum foil 52. Optionally, the material for the layer 55 may be an electrically insulating material such as but not limited to an oxide, alumina, or similar materials. For any of the embodiments herein, the layer 55 may be used with or without the layer 57.

The nascent absorber layer 56 may include material containing elements of groups IB, IIIA, and (optionally) VIA. Optionally, the absorber layer copper (Cu) is the group IB element, Gallium (Ga) and/or Indium (In) and/or Aluminum may be the group IIIA elements and Selenium (Se) and/or Sulfur (S) as group VIA elements. The group VIA element may be incorporated into the nascent absorber layer 56 when it is initially solution deposited or during subsequent processing to form a final absorber layer from the nascent absorber layer 56. The nascent absorber layer 56 may be about 1000 nm thick when deposited. Subsequent rapid thermal processing and incorporation of group VIA elements may change the morphology of the resulting absorber layer such that it increases in thickness (e.g., to about twice as much as the nascent layer thickness under some circumstances).

Fabrication of the absorber layer on the aluminum foil substrate 52 is relatively straightforward. First, the nascent absorber layer is deposited on the substrate 52 either directly on the aluminum or on an uppermost layer such as the electrode 54. By way of example, and without loss of generality, the nascent absorber layer may be deposited in the form of a film of a solution-based precursor material containing nanoparticles that include one or more elements of groups IB, IIIA and (optionally) VIA. Examples of such films of such solution-based printing techniques are described e.g., in commonly-assigned U.S. patent application Ser. No. 10/782,017, entitled "SOLUTION-BASED FABRICATION OF PHOTOVOLTAIC CELL" and also in PCT Publication WO 02/084708, entitled "METHOD OF FORMING SEMICONDUCTOR COMPOUND FILM FOR FABRICATION OF ELECTRONIC DEVICE AND FILM PRODUCED BY SAME" the disclosures of both of which are incorporated herein by reference.

In the present embodiment, layer 58 may be an n-type semiconductor thin film that serves as a junction partner between the compound film and the transparent conducting layer 59. By way of example, the n-type semiconductor thin film 58 (sometimes referred to as a junction partner layer) may include inorganic materials such as cadmium sulfide (CdS), zinc sulfide (ZnS), zinc hydroxide, zinc selenide (ZnSe), n-type organic materials, or some combination of two or more of these or similar materials, or organic materials such as n-type polymers and/or small molecules. Layers of these materials may be deposited, e.g., by chemical bath deposition (CBD) and/or chemical surface deposition (and/or related methods), to a thickness ranging from about 2 nm to about 1000 nm, more preferably from about 5 nm to about 500 nm, and most preferably from about 10 nm to about 300 nm. This may also be configured for use in a continuous roll-to-roll and/or segmented roll-to-roll and/or a batch mode system.

The transparent conductive layer 59 may be inorganic, e.g., a transparent conductive oxide (TCO) such as but not limited to indium tin oxide (ITO), fluorinated indium tin oxide, zinc oxide (ZnO) or aluminum doped zinc oxide, or a related material, which can be deposited using any of a variety of means including but not limited to sputtering, evaporation, chemical bath deposition (CBD), electroplating, sol-gel based coating, spray coating, chemical vapor deposition (CVD), physical vapor deposition (PVD), atomic layer deposition (ALD), and the like. Alternatively, the transparent conductive layer may include a transparent conductive polymeric layer, e.g. a transparent layer of doped PEDOT (Poly-3,4-Ethylenedioxythiophene), carbon nanotubes or related structures, or other transparent organic materials, either singly or in combination, which can be deposited using spin, dip, or spray coating, and the like or using any of various vapor deposition techniques. Optionally, it should be understood that intrinsic (non-conductive) i-ZnO may be used between CdS and Al-doped ZnO. Combinations of inorganic and organic materials can also be used to form a hybrid transparent conductive layer. Thus, the layer 59 may optionally be an organic (polymeric or a mixed polymeric-molecular) or a hybrid (organic-inorganic) material. Examples of such a transparent conductive layer are described e.g., in commonly-assigned US Patent Application Publication Number 20040187317, which is incorporated herein by reference.

Those of skill in the art will be able to devise variations on the above embodiments that are within the scope of these teachings. For example, it is noted that in embodiments of the present invention, portions of the IB-IIIA precursor layers (or certain sub-layers of the precursor layers or other layers in the stack) may be deposited using techniques other than particle-based inks. For example precursor layers or constituent sub-layers may be deposited using any of a variety of alternative deposition techniques including but not limited to solution-deposition of spherical nanopowder-based inks, vapor deposition techniques such as ALD, evaporation, sputtering, CVD, PVD, electroplating and the like.

Solution Deposited Transparent Conductors

Figure 2:
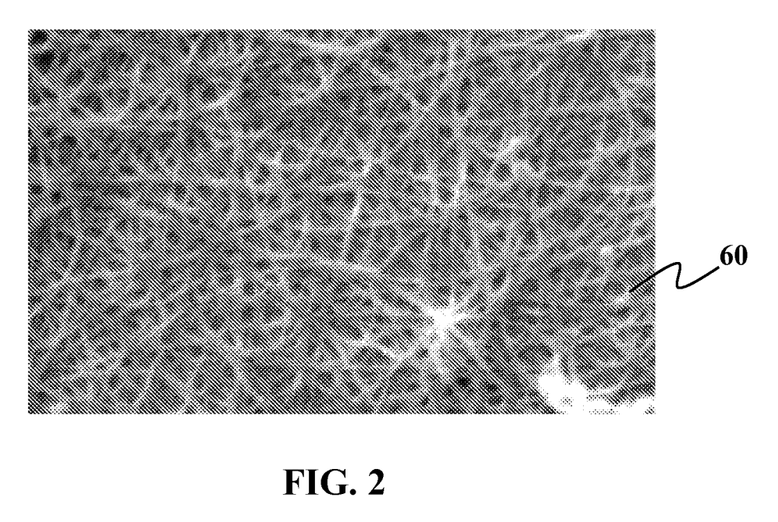
FIG. 2 shows an image of nanotubes according to one embodiment of the present invention.

Referring now to FIG. 2, yet another embodiment of the present invention will now be described. This embodiment of the invention shows that the material in the transparent electrode layer 59 may be replaced with non-traditional transparent electrode material such as, but not limited to, carbon nanotubes 66 as shown in the top down view of FIG. 2.

Carbon nanotubes (CNTs) 66 and/or other conductive fibrous materials can provide electrical conductance at packing densities that provide partial optical transparency. Optionally, the layer has very little absorbance in the spectral range from about 400 nm to about 1100 nm. As seen in FIG. 2, the carbon nanotubes 66 when deposited resemble a fibrous or web-like covering. It should be understood that the fibrous conductor may be used with or without i-ZnO. Besides carbon nanotubes, other suitable materials may also be used for a printable transparent conductor. Some embodiments may comprise of metal-based nanoassembled layers that are suitable as transparent conductors. These materials may also be fibrous in nature.

A spectrum of techniques and device constructions may be used for applying these materials to the fabrication of low-cost, long-lived thin-film solar cells, in particular cells constructed on low-cost metal foils, including cells fashioned in an emitter wrap-through structure. Examples of suitable solution deposition methods may include at least one method from the group comprising: wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink-jet printing, jet deposition, spray deposition, aerosol spray deposition, dip coating, web coating, microgravure web coating, or combinations thereof. These applications of carbon nanotubes provide new avenues to lower costs, better durability, better thermal stability, and higher efficiencies. Of course, other non-solution based techniques may also be used.

Although promising, the work on replacing the known transparent electrode is not without challenges in terms of process ease or expense. The cell performance may be worse (low shunt resistance) when the carbon nanotubes layer 66 is used in conjunction with printable CIGS on glass with evaporated selenium/RTP selenization and thin i-ZnO. Upon further investigation, one reason for the shunting is because the absorber layer 56 is too rough to be protected by the i-ZnO and the electrical properties may not be suited for further protection like those of the ZnO:Al are.

To address some of these issues, one embodiment of the present invention may address the issue by designing a smoother interface with the transparent conductor layer. This may involve adjusting or modifying the substrate on which the absorber layer 56 is formed or other techniques. By modifying the underlying layer, this results in an absorber layer 56 that is smoother without actually adding additional surface treatment to the absorber layer 56 itself. If the absorber layer 56 is sufficiently smooth, then the shunting issue would be minimized and a number of various materials may be used to provide the insulation desired at that interface. Examples of layers that can be deposited before the layer of carbon nanotubes layer 66 in this case are insulating polymers deposited by standard solution coatings, polyelectrolytes deposited via dip casting or a bath technique, sol gels resulting in inorganic or metal-organic layers, or similar materials.

Alternative Embodiments

Note that for either the smooth or rough case that the insulator material could also be the same material as the pottant/encapsulating material, or a material that provides better adhesion for the pottant, or a material that protects the cell from the potent. This also applies even if the embodiments use i-ZnO on smooth CIGS because the CNTs may desire a binder to give them extra stability. In this case that binder can be the pottant/encapsulating material, or a material that provides better adhesion for the pottant, EVA and related compounds, are candidates. Binders include millions that are commercially available.

Optionally, the use of web-like layer of conductive material such as carbon nanotubes may replace both the ZnO:Al and i-ZnO layers in a solar cell. Embodiments of the present invention may use a solution coated CNT transparent conductor without shunting by using smooth instead of rough absorber layers. Optionally the present invention may use a rough absorber layer that is treated with other layers to minimize shunting.

Figure 3A:
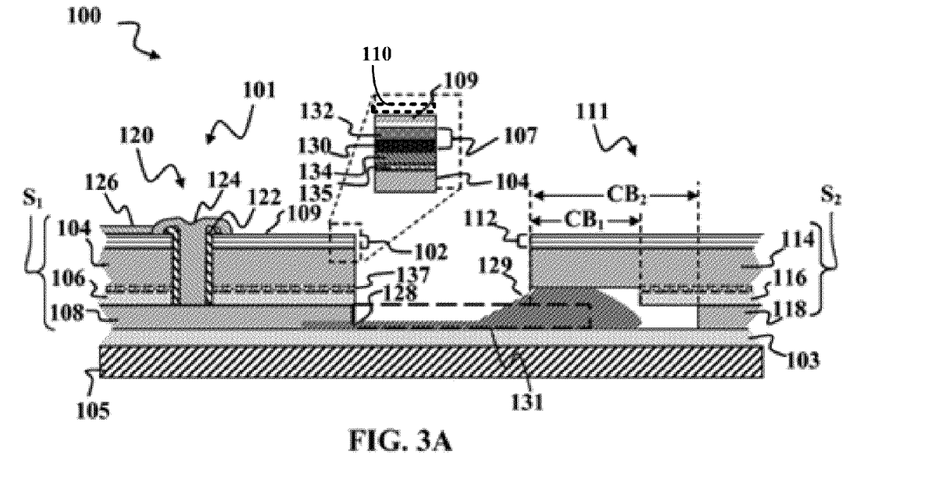
FIGS. 3A and 3B show cross-sectional and top down views of photovoltaic devices according to embodiments of the present invention.
Figure 3B:
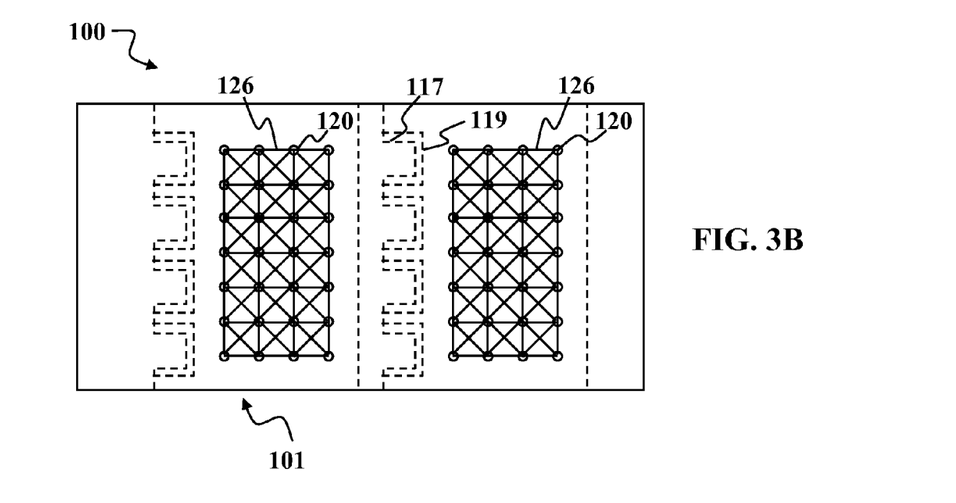

Embodiments of the present invention also contemplate the facilitation of EWT style cells with group IB-IIIA-VIA absorber layers as seen in FIG. 3A. If the ZnO:Al cannot be eliminated, it can be made thinner by combining it with the web-like transparent conductor layer.

Optionally, instead of ZnO:Al, in the one embodiment of the present invention the entire layer may be replaced by a layer of CNT or other fibrous or porous layer.

Optionally, the web-like transparent conductor layer is used in conjunction with ZnO:Al to make thinner ZnO:Al layers. By way of nonlimiting example, carbon nanotubes as a first layer and very thin metal oxide coating as an overlayer that provides mechanical cohesion (e.g. as a binder) of the underlying nanotube coating and provides top surface chemical durability for long service life. The thickness of the ZnO:Al layer may be in the range of about 50 nm to about 500 nm.

Optionally, instead of all ZnO, the entire layer may be replaced by a layer of CNT or other fibrous or porous layer.

Optionally, on top of ZnO, the entire layer may be replaced by a layer of CNT or other fibrous or porous layer as the primary or sole transparent conductor for lateral conduction, whether assisted or not by a conductive (metallic) grid Optionally, in between ZnO:Al and i-ZnO layers, the layer may be replaced by a layer of CNT or other fibrous or porous layer.

Optionally, in between multiple ZnO:Al layers, the web-like transparent conductor layer may be used.

Optionally, in between multiple i-ZnO layers, the web-like transparent conductor layer.

Optionally, in place of CdS and ZnO, a web-like transparent conductor may be used. The web-like transparent conductor may be bound by a suitable binder. A material such as ZnS, CdS, or ZnO may be used to provide a matrix wherein the web-like transparent conductor is used to improve the conductivity of the surrounding material (ZnS, CdS, or ZnO) used as the junction partner with the absorber layer.

Optionally, in place of fingers, a web-like transparent conductor layer may be used.

Optionally, in place of bus bar, a web-like transparent conductor layer may be used.

Optionally, in conjunction with a binder to provide stability to the layer. The binder may be a conductive binder. The binder may be a material that is suitable as a junction partner with the absorber layer.

Optionally, using the same binder as the insulator and/or adhesive required to laminate and seal the strings/modules.

Optionally, using the same binder as a thin layer between the CNT layer and CIGS/(CdS) to prevent shunting in place of i-ZnO.

Optionally, in conjunction with a conformal deposition of insulating material to prevent shunting where usually the roughness of the CIGS prevents continuous coverage of a sputtered layer.

Optionally, in conjunction with ALD deposited insulator, e.g. using an ALD top coating to provide both a binder function to the underlying nanotubes and an environmental protection function vis-à-vis cell stability in the field Optionally, in conjunction with an insulating binder or other overlayer to protect the device whereby electrical contact can only be made by penetrating the protective layer (with via for example)

Optionally, a web-like transparent conductor layer may be used with an emitter wrap through (EWT) type solar cell. Further details of such an embodiment may be found with reference to FIG. 4. If used with an EWT solar, the following may apply:

a. A web-like transparent conductor layer may be used as the conductive transparent top coating of an emitter wrap through (EWT) cell structure, where a sheet resistance of about 10- about 1000 ohm/sq is used, optionally about 40-about 200 ohm/sq, or optionally about 50- about 100 ohm/sq b. A web-like transparent conductor layer may be used as a conductive transparent top coating deposited on a EWT cell stack after the formation of insulated holes, serving thereby to provide both lateral sheet conductance and through-hole conductance.

c. A web-like transparent conductor layer may be used as a conductive transparent element providing better cell durability as a result of better thermal expansion matching and better adhesion to EWT materials of construction.

Note that an additional advantage with EWT might be related to the solution processibility in that hole punching might cause less damage to them or that they can be applied after the hole and used also as the wrap through conductor.

Optionally, a web-like transparent conductor layer may be used on CIGS cells made on metal foil (thus giving them the smoothness desired for complete insulator coverage)

Optionally, a web-like transparent conductor layer may be used to make layers or lines <0.01 ohm/sq Optionally, a web-like transparent conductor layer may be used to make layers or lines 50 ohm/sq Optionally, a web-like transparent conductor layer may be used to make layers or lines 200 ohm/sq for use with EWT technology Optionally, a web-like transparent conductor layer may be used to make layers or lines >500 ohm/sq (see static claim)

Optionally, a web-like transparent conductor layer may be used to make anti-static coatings for solar modules Optionally, a web-like transparent conductor layer may be used as via filler material in EWT cells Optionally, a web-like transparent conductor layer may be used as a transparent conductive element in a thin-film solar cell comprising films fabricated from nanoparticulate materials   a. wherein the nanoparticulate materials are deposited in layers   b. wherein the nanoparticulate materials are sintered into solid films   c. wherein the nanoparticulate materials are precursors to group IB-IIIA-VIA films, CuInSe2 films, and/or alloys of CIS comprising Ga and/or S   d. wherein the cell constructed as an emitter wrap through design   e. wherein the comprising a flexible substrate   f. wherein the comprising a metal foil (substrate)

Although ZnO:Al and i-ZnO are used above, it should be understood that their use is purely exemplary and more generally speaking, various "conductive TCO" and "insulating TCO" are suitable.

TCE Qualities

Although not limited to the following, the conductivity desired for solution deposited transparent conductor on solar cells may be on the order of about 100 $\Omega$/sq., optionally not more than about 200 $\Omega$/sq., and optionally as low as about 10 $\Omega$/sq or less, with very little absorbance in the spectral range from about 400 to about 1100 nm (the difference between actual and 100% transmittance should ideally be solely reflectance, which for the realized indices of refraction of TCO films is around 10-15%). ITO films, especially if deposited at temperatures of a few hundred C, can provide 20 $\Omega$/sq with no absorbance; below that value the absorbance begins to be significant. Al:ZnO is similar though generally not as good. In both cases, the transmittance is around about 85-90% over most of the wavelength range.

One way to avoid the difficulties inherent in transparent oxides is to use very narrow lines of excellent metallic conductors, with wide open regions in between. To illustrate the performance of such an architecture, consider the resistance of an array of silver lines, 40 nm wide and 40 nm high. If 1000 such lines are placed in parallel, spaced 10 pm apart (so the array is 1 cm wide), the sheet resistance would be 100 $\Omega$/sq., which is a useful range for solar cell electrodes. At the same time, the optical transmittance would be >99% (obscured area 0.4%).

Although not limited to the following, the synthesis of silver nanorods with diameters of about 35 nm ($\pm$5 nm) and lengths of several microns (up to 18 microns) has been described in the scientific literature (Cathy Murphy et al., Nanoletters, vol. 3, p. 667, 2003). The conductivity of these essentially single crystal nanorods is close to the bulk silver resistivity value of $1.6 \times 10^{-6}$ cm. Thus they would come within a factor of two or better of meeting the target of the hypothetical structure proposed above, if they could be connected in continuous lines and distributed with their axes parallel.

One method of making such connections is to simply line the rods up so that their ends are, on average, close to one another, and introduce a conducting medium in between. The conducting medium can be something of much lesser conductivity, such as Al:ZnO, for example. The result is a set of very low resistance resistors, several microns long, in series with high resistance resistors which are in general much shorter. The exact length of the high resistance elements depends on the method of orienting the rods. For example, flow orientation may be used: the rods are deposited in a linear coating flow, as typical of web coating. The extremely large aspect ratio of the rods assists in making them orient in the flow direction; polymers (later removed) can be used to refine this order.

If the rods align predominantly into columns in the direction of flow, as is expected, then the actual resistance of a chain may be only a few times the value of an ideal continuous chain. Alternatively, one may use capping techniques to attach functional end groups to the chains. It is known in the literature that reaction rates with ligands (typically organic or organometallic molecules) are sensitive to crystal facet, so that groups can be added preferentially to the rod ends and not to the sides. These groups can then be used to attach the rods into long chains.

Note that the actual effectiveness of such rods is greater than the simple calculation, in that the shadowing above was calculated assuming a square cross section. In fact the rods are round, and this means that light striking them will bounce off in a range of directions. If they are encased in a surrounding medium with some typical index of refraction in the range of 1.4-1.7, then rays with reflected angles greater than −55 deg. from the vertical will be totally internally reflected at the medium-air interface, and when they come down a second time they are unlikely to strike another Ag nanorod, and so will enter the solar cell absorber layer. Thus, careful choice of surrounding medium (specifically the dielectric whose upper surface is in contact with air) can allow up to a few percent blockage of light, and still be superior to existing solutions with respect to optical loss. This means that the rods can be closer than 10 um laterally, and this increases the probability of nanoscale separations between rod ends. The electrically connecting medium can be supplied by conventional means, such as sputtering, or by some solution technique In one embodiment, the ink may optionally contain a mixture of transparent inorganic hard-to-compress (nano)powder or (nano) particles, preferably transparent conductive hardto-compress (nano)powder, for instance ITO or AZO, with highly-conductive metallic particles, for instance metallic nanowires. Of course, other suitable materials as described herein may also be used, singly or two or more combinations. Apart from mixing transparent metal oxide particles (spheres, flakes, tetrapods, rods, wires) with metallic nanowires (made from for instance but not limited to silver, copper, or aluminum) other shapes than nanowires can be used as well. Additionally in an optional embodiment, it would be beneficial if the metallic particles would have a relatively low melting point (<250C) and/or would be malleable (meaning easy to change form/shape upon applying external forces). Examples are gallium, indium, and typically used solder materials (see next paragraph). The low melting point would allow for sintering (defined as an increase in contact area between the particles in the as-deposited layer) at relatively low temperatures. The malleability would allow for low-temperature compression that would result in an enhanced contact area between the particles. Note that compression for as-deposited nanotubes or nanowires without added transparent inorganic hard-to-compress particles only allows a very limited amount of compression. Over-compression of this type of layers can result in a tremendous loss of transparency. Note that sintering of metallic particles with transparent conductive particles, as suggested herein, will enhance the number of conductive pathways allowing enhanced lateral conductivity, without loosing too much transparency.

Regarding the metallic materials, one possibility would be to use particles (or flakes) of relatively low-melting conductive material (preferably melting in a range of 150-250C), and heat the layer (and substrate) to a temperature where the metallic material sinters with the other particles without damaging the underlying layers. Examples are Sn—Bi, Pb—Sn, Zn—Sn, Ag—Sn, and Al—Sn. Another possibility would be to use a mixture of at least two different types of metallic particles (or flakes) where one particle has an melting point below 150C, preferably below 10° C., and where the heating results in the formation of a conductive alloy (solid-solution or line-compound) with a high melting-point, preferably far above 150C. Examples are alloys with low-melting materials like Ga, Cs, Rb, and Hg combined with high-melting materials like Al, Cu, Fe, Ni, to form for example a Al—Ga solid-solution, Cu—Ga solid-solution or line-compound, etc.

Regarding methods, it should be understood that a two-step deposition of low-organic-containing conductive material followed by a high-organic-containing mechanical stabilizer will improve both the morphology of the conductive matrix and enlarge the contact area between the conductive material and the underlying surface, if compression and/or heating need to be limited, and the top surface not necessarily is in direct contact with conductive material. Optionally, some embodiments may reverse the sequence and apply the high-organic-containing material first.

The process is preferably roll-to-roll, but use of rigid substrates is not excluded. NON-VACUUM TCE DEPOSITION AND PRECURSOR-CONVERSION METHODS Deposition methods include but are not limited to Roll-to-Roll Atomic Layer Deposition (R2R-ALD), Roll-to-Roll Chemical Vapor Deposition (R2R-CVD), Roll-to-Roll Lamination (R2R-lamination) of transparent conductive film, wet deposition via e.g. microgravure coating and spraying of soluble metal organic precursor. Some suitable in-line roll to roll techniques are described in U.S. patent application Ser. No. 10/782,233 filed Feb. 19, 2004 and fully incorporated herein by reference for all purposes.

TCE PROPERTIES

The following are exemplary and nonlimiting. In one embodiment, thickness, may optionally be below 1 micron. Optionally, transparency >80%. Optionally, conductivity may be <200 Ohm/square, even more preferably 100 Ohm/square, even more preferred <50 Ohm/square.

Thermomechanical properties: Optionally, contact resistance, may optionally be below 1.0 mOhm-cm. The material typically has chemical resistance to laminated materials on top of the TCE material.

TCE Three-Dimensional Structure

In one embodiment, the 3D-structure may random, organized, or parallel.

In one embodiment, the thickness of may be in the range of about 50 nm to about 1000 nm. Optionally, the thickness of layer may be in the range of about 100 nm to about 500 nm. Optionally, the thickness of layer may be in the range of about 150 nm to about 300 nm.

In yet another embodiment of the present invention, the use of the nanotubes or nanowires is likely to allow thinner ZnO:Al or other TCO. This embodiment does not involve replacing ZnO:Al but using it in conjunction with the appropriate web-like conductor. ZnO:Al or other transparent conductive material as thin as about 100 nm might be enough to stop shunting. Optionally, the layer of ZnO:Al or other transparent conductive material may be about 100 to about 200 nm in thickness. Optionally, the layer of ZnO Al or other transparent conductive material may be about 100 to about 500 nm in thickness. CNTs or metal nanowires may be formed on top of this layer or in this layer. Instead they are agglomerated and form particle monolayers. This saves time in sputtering and materials used for ZnO:Al. In one embodiment, the ZnO:Al may be below the CNT or other web like layer. In one embodiment, the ZnO:Al may be above the CNT or other web like layer.

Adhesion with Minimal Loss of Contact Resistance

Where various materials, like metals, provide both low volume resistivity and low contact resistance, typically these materials have low optical transparency.

CONDUCTIVE PRECURSOR IMPROVING VOLUME RESISTIVITY UPON CONVERSION. By way of example and not limitation, this may include TiO2 via metal deposition followed by oxygen plasma treatment. Optionally, this may include TiO2 core, Ti shell, oxygen plasma treatment. Optionally, this may include ZnO:Al core, Ti shell, oxygen plasma treatment. Optionally, this may include precursor to metal, e.g. metal organic compounds that decompose upon heat.

Conductive Filler Improving Volume Resistivity Upon Filling

This may include use of one or more of the following: fillers; wires, 3D-structures, cables, spheres, tetrapods, and/or combinations of the foregoing.

HYBRIDS OF THE FOREGOING may include multiple depositions, conversions, materials, timing (prior to, during, or after) for any of the steps herein.

Transparent Conductive Electrode Film Materials

Optionally, the transparent conductive electrode film may include materials; metals, conductive oxides, conductive nitrides, conjugated molecules, conjugated polymers, fullerenes, TCO particles, doped semiconductor particles (spheres, tetrapods, rods, wires), SOLDERS, Ga-AMALGAMS, TCO: AZO, GZO, BZO, ITO and the like.

Optionally, the material may be organo-metallic precursor containing either Al, Ga, and/or B & TCO particles.

Optionally, the method may include depositing molecularly dissolved or solid particles of organo-metallic precursors containing Zn, and dopants like Al, B, Ga, and/or other dopants, graphite sheets, the like, and/or combinations of the foregoing. Any of the techniques may be combined in single or multiple combinations of any other technique described herein.

Optionally, the method may include using ultrathin layer of metal (using techniques such as but not limited to electroless deposition, ALD, thermal decomposition of a solution-deposited soluble metal precursor, or the like), like Ti, Zn, Zr or the like providing metal contact between silver fingers and TCO, but oxidizing the unexposed metal via e.g. an atmospheric oxygen plasma will improve transparency; Cu, Sn, Hf, Ru.

Optionally, the method may include integrating traces/grids/fingers/lines with underlying TCE.

Typically in thin-film PV, Liquid Crystal Displays, Light emitting diodes, and other opto-electronic applications, the transparent conductive layer is a transparent conductive oxide deposited in slow expensive vacuum equipment. New lower-cost materials and lower-cost deposition methods that have been developed are solution-deposition of carbon nanotubes or metal nanowires that both result in a more or less random percolating network of conductive tubes/wires. Typically these networks are stabilized by co-deposition or over-coating with a polymer matrix. Relying on percolating networks, and therefore a combination of hopping conduction and conduction through the wires/tubes limits the conductivity and/or the transparency especially when both the transparency and the conductivity need to be increased simultaneously.

The embodiments described here allow not only for an alternative method, but also for a better combined performance from both an electrical and optical point-of-view, meaning the invention allows for more facile and independent adjustment of conductivity (in all three dimensions) and optical properties (minimize optical losses).

Figure 4:
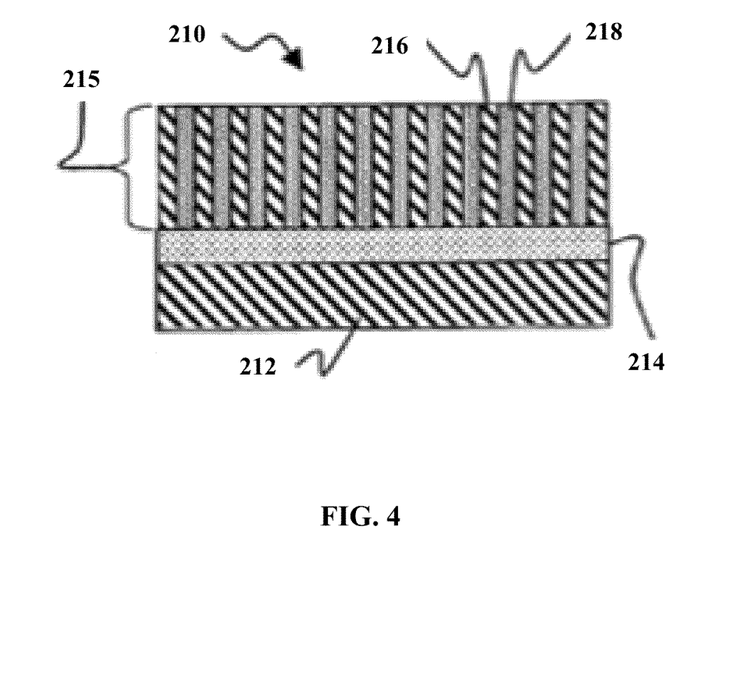
FIG. 4 is an exemplary embodiment of material deposited into pores of a block co-polymer, as disclosed in FIG. 1B of U.S. patent application Ser. No. 10/338,079, now issued as U.S. Pat. No. 7,594,982.

The preferred method of creating a low-temperature curable transparent conductor is by solution deposition of transparent block-co-polymers combined with simultaneous or subsequent deposition of metal precursors that will fill the pores with a metal organized 3D-network. Depending on the type of block-co-polymers and chemistry used for the metallization of the porous highly organized block-co-polymer network, the filling of the pores can either be performed on top of the stack/substrate in the final product, or separately, and subsequently be transferred as a mechanically stable film to the final product followed by lamination. Filling the pores of the block-co-polymer structure can be performed by electro-deposition, electro-less deposition, like chemical bath deposition, chemical surface deposition, and horizontal bath deposition, spraying, solution coating, solution printing, etc. Similar precursors can be used as applied for wet chemical synthesis of metal nano-powders. Other deposition methods that can be used to fill the polymer network are atomic layer deposition, chemical vapor deposition, and the like. FIG. 4 shows an exemplary embodiment of a transparent conducting electrode 210 according to an embodiment of the present invention. The transparent conducting electrode 210 includes an optional substrate 212, a layer of transparent conducting material 214 and a nanostructured layer 215. The nanostructured layer 215 includes an ordered network of interconnected conducting structures, e.g., in the form of a nano-architected porous film 216 having a network of interconnected pores and a conducting material 218 that fills pores in the nano-architected porous film 216.

Apart from filling the polymer network with metallic precursors that convert to metal, the porous polymer network can be filled with carbon black, fullerenes, metal nanopowder, transparent conductive oxide precursors (sol-gel), TCO nanopowder, or filled by vacuum deposition of TCO (or metal). The latter two examples (using vacuum deposition to fill a porous polymer network) would be particularly interesting when transferring a mechanically stable polymer film filled with conductive material to the final product, where the final product cannot withstand high temperatures and the curing of the polymer network with/without curing of the conductive network requires high temperatures.

One embodiment of the invention may comprise of high-efficiency thin-film solar cells based on polycrystalline CIGS (copper indium gallium di-selenide, but not excluding any other of the IB, IIIA, VIA elements like e.g. aluminum, and sulfur) are typically made with a transparent conductive oxide on top requiring additional conductive patterns to collect the current with minimal resistive losses. Lowering the cost of the deposition of these patterns is required to minimize the overall cost of the solar panels.

One major challenge to make highly-conductive patterns via solution-deposition is to be able to formulate an ink (slurry, paste, dispersion, emulsion, paint) that allows solution-deposition of conductive materials onto a substrate without the negative influence organic additives might have on the contact resistance to the substrate (being the transparent conductive oxide) and conductivity within the bulk of the pattern, since typically solution-deposited patterns rely on hopping conductance between particles thereby making the conductivity (but also the contact area for the conductive material in the two-phase patterns with the substrate) very sensitive to the morphology of the two-phase system of insulating-organic and conductive material. Additionally, subsequent heating (temperature and time) to mechanically stabilize these patterns and/or improve on contact resistance and/or improve on bulk-conductivity needs to be limited not to damage the underlying layers. Furthermore, the difference in the coefficient of thermal expansion between organic additives and the conductive component in the ink is typically large, which might cause difficulties during heating after solution-deposition or might limit the stability of these patterns over time.

In order to overcome the difficulties with typical inks used for solution-deposition, a new material and method is proposed in this invention disclosure.

Regarding materials: One embodiment uses particles (or flakes) of relatively low-melting conductive material (preferably melting in a range of 150-250C), and heat the pattern (and substrate) to a temperature where the conductive material sinters without damaging the underlying layers. Examples include but are not limited to Sn—Bi, Pb—Sn, Zn—Sn, Ag—Sn, and Al—Sn. Another possibility would be to use a mixture of at least two different types of particles (or flakes) where one particle has an melting point below 150C, preferably below 100C, and where the heating results in the formation of a conductive alloy (solid-solution or line-compound) with a high melting-point, preferably far above 150C. Examples are alloys with low-melting materials like Ga, Cs, Rb, and Hg combined with high-melting materials like Al, Cu, Fe, Ni, to form for example a Al—Ga solid-solution, Cu—Ga solid-solution or line-compound, etc.

Regarding method, one embodiment may use a two-step deposition of low-organic-containing conductive material followed by a high-organic-containing mechanical stabilizer will improve both the morphology of the conductive matrix and enlarge the contact area between the conductive material and the substrate (TCO).

The process is preferably roll-to-roll, but use of rigid substrates is not excluded.

Photovoltaic Device Chemistry

A variety of different chemistries to arrive at a desired semiconductor film for the absorber layer and the solution deposited transparent conductor is not limited to any particular type of solar cell or absorber layer. Although not limited to the following, an active layer for a photovoltaic device may be fabricated by formulating an ink of spherical and/or non-spherical particles each containing at least one element from groups IB, IIIA and/or VIA, coating a substrate with the ink to form a precursor layer, and heating the precursor layer to form a dense film. By way of nonlimiting example, the particles themselves may be elemental particles or alloy particles. In some embodiments, the precursor layer forms the desired group IB-IIIA-VIA compound in a one step process. In other embodiments, a two step process is used wherein a dense film is formed and then further processed in a suitable atmosphere to form the desired group IB-IIIA-VIA compound. It should be understood that chemical reduction and/or densification of the precursor layer may not be needed in some embodiments, particularly if the precursor materials are oxygen-free or substantially oxygen free. Thus, a first heating step of two sequential heating steps may optionally be skipped if the particles are processed air-free and are oxygen-free. The resulting group IB-IIIA-VIA compound for either a one step or a two step process is preferably a compound of Cu, In, Ga and selenium (Se) and/or sulfur S of the form $CuIn_{(1-x)}Ga_xS_{2(1-y)}Se_{2y}$, where $0 \leq x \leq 1$ and $0 \leq y \leq 1$. Optionally, the resulting group IB-IIIA-VIA compound may be a compound of Cu, In, Ga and selenium (Se) and/or sulfur S of the form $Cu_zIn_{(1-x)}Ga_xS_{2(1-y)}Se_{2y}$, where $0.5 \leq z \leq 1.5$, $0 \leq x \leq 1.0$ and $0 \leq y \leq 1.0$. Optionally, the resulting group IB-IIIA-VIA thin-film may be a mixture of compounds of Cu, In, Ga and selenium (Se) and/or sulfur S of the form $Cu_zIn_{(1-x)}Ga_xS_{(2+w)(1-y)}Se_{(2+w)y}$, where $0.5 \leq z \leq 1.5$, $0 \leq x \leq 1.0$, $0 \leq y \leq 1.0$, and $0 \leq w \leq 0.5$.

It should also be understood that group IB, IIIA, and VIA elements other than Cu, In, Ga, Se, and S may be included in the description of the IB-IIIA-VIA materials described herein, and that the use of a hyphen ("-" e.g., in Cu—Se or Cu—In—Se) does not indicate a compound, but rather indicates a coexisting mixture of the elements joined by the hyphen. It is also understood that group IB is sometimes referred to as group 11, group IIIA is sometimes referred to as group 13 and group VIA is sometimes referred to as group 16. Furthermore, elements of group VIA (16) are sometimes referred to as chalcogens. Where several elements can be combined with or substituted for each other, such as In and Ga, or Se, and S, in embodiments of the present invention, it is not uncommon in this art to include in a set of parentheses those elements that can be combined or interchanged, such as (In, Ga) or (Se, S). The descriptions in this specification sometimes use this convenience. Finally, also for convenience, the elements are discussed with their commonly accepted chemical symbols. Group IB elements suitable for use in the method of this invention include copper (Cu), silver (Ag), and gold (Au). Preferably the group IB element is copper (Cu). Group IIIA elements suitable for use in the method of this invention include gallium (Ga), indium (In), aluminum (Al), and thallium (Tl). Preferably the group IIIA element is gallium (Ga) and/or indium (In). Group VIA elements of interest include selenium (Se), sulfur (S), and tellurium (Te), and preferably the group VIA element is either Se and/or S. It should be understood that mixtures such as, but not limited to, alloys, solid solutions, and compounds of any of the above can also be used. The shapes of the solid particles may be any of those described herein.

High Efficiency Cell Configuration

It should be understood that the device manufactured as shown in FIG. 1 and the above paragraphs may be suitable for use in a high efficiency cell configuration as detailed below in FIG. 3A. FIG. 3A illustrates an array 100 of optoelectronic devices according to an embodiment of the present invention. In some embodiments, this may be considered a series interconnection in an array 100 of optoelectronic devices. The array 100 includes a first device module 101 and a second device module 111. The device modules 101, 111 may be photovoltaic devices, such as solar cells, or light-emitting devices, such as light-emitting diodes. In a preferred embodiment, the device modules 101, 111 are solar cells. The first and second device modules 101, 111 are attached to an insulating carrier substrate 103, which may be made of a plastic material such as polyethylene terephthalate (PET), e.g., about 50 microns thick. The carrier substrate 103 may, in turn, be attached to a thicker structural membrane 105, e.g., made of a polymeric roofing membrane material such as thermoplastic polyolefin (TPO) or ethylene propylene diene monomer (EPDM), to facilitate installing the array 100 on an outdoor location such as a roof.

By way of nonlimiting example, the device modules 101, 111, which may be about 4 inches in length and 12 inches wide, may be cut from a much longer sheet containing several layers that are laminated together. Each device module 101, 111 generally includes a device layer 102, 112 in contact with a bottom electrode 104, 114 and an insulating layer 106, 116 between the bottom electrode 104, 114 and a conductive back plane 108, 118. It should be understood that in some embodiments of the present invention, the back plane 108, 118 may be described as a backside top electrode 108, 118. The bottom electrodes 104, 114, insulating layers 106, 116 and back planes 108, 118 for substrates $S_1$, $S_2$ support the device layers 102, 112

In contrast to prior art cells, where the substrates are formed by depositing thin metal layers on an insulating substrate, embodiments of the present invention utilize substrates $S_1$, $S_2$ based on flexible bulk conducting materials, such as foils. Although bulk materials such as foils are thicker than prior art vacuum deposited metal layers they can also be cheaper, more readily available and easier to work with. Preferably, at least the bottom electrode 104, 114 is made of a metal foil, such as aluminum foil. Alternatively, copper, stainless steel, titanium, molybdenum or other suitable metal foils may be used. By way of example, the bottom electrodes 104, 114 and back planes 108, 118 may be made of aluminum foil about 1 micron to about 200 microns thick, preferably about 25 microns to about 100 microns thick; the insulating layers 106, 116 may be made of a plastic foil material, such as polyethylene terephthalate (PET) about 1 micron to about 200 microns thick, preferably about 10 microns to about 50 microns thick. In one embodiment, among others, the bottom electrode 104, 114, insulating layer 106, 116 and back plane 108, 118 are laminated together to form the starting substrates $S_1$, $S_2$. Although foils may be used for both the bottom electrode 104, 114 and the back plane 108, 118 it is also possible to use a mesh grid on the back of the insulating layer 106, 116 as a back plane. Such a grid may be printed onto the back of the insulating layer 106, 116 using a conductive ink or paint. One example, among others, of a suitable conductive paint or ink is Dow Corning® PI-2000 Highly Conductive Silver Ink available from Dow Corning Corporation of Midland Mich. Dow Corning® is a registered trademark of Dow Corning Corporation of Midland Mich. Furthermore, the insulating layer 106, 116 may be formed by anodizing a surface of a foil used for the bottom electrode 104, 114 or back plane 108, 118 or both, or by applying an insulating coating by spraying, coating, or printing techniques known in the art.

The device layers 102, 112 generally include an active layer 107 disposed between a transparent conductive layer 109 and the bottom electrode 104. It should be understood that the transparent conductive layer 109 may be any of the solution deposited transparent conductors described herein. Sacrificial layer 110, indicated by dotted lines, may be used to transfer transparent conductive layer 109 to the active layer 107. Optionally, the transparent conductor layer 109 may be metal rod, nanotube, web-like, or mesh-type electrode with sufficient spacing between elements so as to be substantially transparent in a spectral range from about 400 nm to about 1100 nm while still capable of carrying an electrical charge laterally. They may be with or without a binder. By way of example, the device layers 102, 112 may be about 2 microns thick. At least the first device 101 includes one or more electrical contacts 120 between the transparent conducting layer 109 and the back plane 108. The electrical contacts 120 are formed through the transparent conducting layer 109, the active layer 107, the bottom electrode 104 and the insulating layer 106. The electrical contacts 120 provide an electrically conductive path between the transparent conducting layer 109 and the back plane 108. The electrical contacts 120 are electrically isolated from the active layer 107, the bottom electrode 104 and the insulating layer 106.

The contacts 120 may each include a via formed through the active layer 107, the transparent conducting layer 109, the bottom electrode 104 and the insulating layer 106. Each via may be about 0.1 millimeters to about 1.5 millimeters, preferably 0.5 millimeters to about 1 millimeter in diameter. The vias may be formed by punching or by drilling, for example by mechanical, laser or electron beam drilling, or by a combination of these techniques. An insulating material 122 coats sidewalls of the via such that a channel is formed through the insulating material 122 to the back plane 108. The insulating material 122 may have a thickness between about 1 micron and about 200 microns, preferably between about 10 microns and about 200 microns.

The insulating material 122 should preferably be at least 10 microns thick to ensure complete coverage of the exposed conductive surfaces behind it. The insulating material 122 may be formed by a variety of printing techniques, including for example inkjet printing or dispensing through an annular nozzle. A plug 124 made of an electrically conductive material at least partially fills the channel and makes electrical contact between the transparent conducting layer 109 and the back plane 108. The electrically conductive material may similarly be printed. A suitable material and method, for example, is inkjet printing of solder (called "solderjet" by Microfab, Inc., Plano, Tex., which sells equipment useful for this purpose). Printing of conductive adhesive materials known in the art for electronics packaging may also be used, provided time is allowed subsequently for solvent removal and curing. The plug 124 may have a diameter between about 5 microns and about 500 microns, preferably between about 25 and about 100 microns.

By way of nonlimiting example, in other embodiments, the device layers 102, 112 may be about 2 microns thick, the bottom electrodes 104, 114 may be made of aluminum foil about 100 microns thick; the insulating layers 106, 116 may be made of a plastic material, such as polyethylene terephthalate (PET) about 25 microns thick; and the backside top electrodes 108, 118 may be made of aluminum foil about 25 microns thick. The device layers 102, 112 may include an active layer 107 disposed between a transparent conductive layer 109 and the bottom electrode 104. In such an embodiment, at least the first device 101 includes one or more electrical contacts 120 between the transparent conducting layer 109 and the backside top electrode 108. The electrical contacts 120 are formed through the transparent conducting layer 109, the active layer 107, the bottom electrode 104 and the insulating layer 106. The electrical contacts 120 provide an electrically conductive path between the transparent conducting layer 109 and the backside top electrode 108. The electrical contacts 120 are electrically isolated from the active layer 107, the bottom electrode 104 and the insulating layer 106.

The formation of good contacts between the conductive plug 124 and the substrate 108 may be assisted by the use of other interface-forming techniques such as ultrasonic welding. An example of a useful technique is the formation of gold stud-bumps, as described for example by J. Jay Wimer in "3-D Chip Scale with Lead-Free Processes" in Semiconductor International, Oct. 1, 2003, which is incorporated herein by reference. Ordinary solders or conductive inks or adhesives may be printed on top of the stud bump.

In forming the vias, it is important to avoid making shorting connections between the top electrode 109 and the bottom electrode 104. Therefore, mechanical cutting techniques such as drilling or punching may be advantageously supplemented by laser ablative removal of a small volume of material near the lip of the via, a few microns deep and a few microns wide. Alternatively, a chemical etching process may be used to remove the transparent conductor over a diameter slightly greater than the via. The etching can be localized, e.g., by printing drops of etchant in the appropriate places using inkjet printing or stencil printing.

A further method for avoiding shorts involves deposition of a thin layer of insulating material on top of the active layer 107 prior to deposition of the transparent conducting layer 109. This insulating layer is preferably several microns thick, and may be in the range of 1 to 100 microns. Since it is deposited only over the area where a via is to be formed (and slightly beyond the borders of the via), its presence does not interfere with the operation of the optoelectronic device. In some embodiments of the present invention, the layer may be similar to structures described in U.S. patent application Ser. No. 10/810,072 to Karl Pichler, filed Mar. 25, 2004, which is hereby incorporated by reference. When a hole is drilled or punched through this structure, there is a layer of insulator between the transparent conducting layer 109 and the bottom electrode 104 which may be relatively thick compared to these layers and to the precision of mechanical cutting processes, so that no short can occur.

The material for this layer can be any convenient insulator, preferably one that can be digitally (e.g. inkjet) printed. Thermoplastic polymers such as Nylon PA6 (melting point (m.p.) 223° C.), acetal (m.p. 165° C.), PBT (structurally similar to PET but with a butyl group replacing the ethyl group) (m.p. 217° C.), and polypropylene (m.p. 165° C.), are examples which by no means exhaust the list of useful materials. These materials may also be used for the insulating layer 122. While inkjet printing is a desirable way to form the insulator islands, other methods of printing or deposition (including conventional photolithography) are also within the scope of the invention.

In forming the vias, it is useful to fabricate the optoelectronic device in at least two initially separate elements, with one comprised of the insulating layer 106, the bottom electrode 104 and the layers 102 above it, and the second comprised of the back plane 108. These two elements are then laminated together after the vias have been formed through the composite structure 106/104/102, but before the vias are filled. After this lamination and via formation, the back plane 108 is laminated to the composite, and the vias are filled as described above.

Although jet-printed solders or conductive adhesives comprise useful materials for forming the conductive via plug 124, it is also possible to form this plug by mechanical means. Thus, for example, a wire of suitable diameter may be placed in the via, forced into contact with the back plane 108, and cut off at the desired height to form the plug 124, in a manner analogous to the formation of gold stud bumps. Alternatively a pre-formed pin of this size can be placed into the hole by a robotic arm. Such pins or wires can be held in place, and their electrical connection to the substrate assisted or assured, by the printing of a very thin layer of conductive adhesive prior to placement of the pin. In this way the problem of long drying time for a thick plug of conductive adhesive is eliminated. The pin can have tips or serrations on it which punch slightly into the back plane 108, further assisting contact. Such pins may be provided with insulation already present, as in the case of insulated wire or coated wire (e.g. by vapor deposition or oxidation). They can be placed in the via before the application of the insulating material, making it easier to introduce this material.

If the pin is made of a suitably hard metal, and has a slightly tapered tip, it may be used to form the via during the punching step. Instead of using a punch or drill, the pin is inserted into the composite 106/104/102, to a depth such that the tip just penetrates the bottom; then when the substrate 108 is laminated to this composite, the tip penetrates slightly into it and forms a good contact. These pins may be injected into the unpunched substrate by, for example, mechanical pressure or air pressure directed through a tube into which the pin just fits.

The first device module 101 may be attached to the carrier substrate 103 such that the back plane 108 makes electrical contact with the thin conducting layer 128 while leaving a portion of the thin conducting layer 128 exposed. Electrical contact may then be made between the exposed portion of the thin conducting layer 128 and the exposed portion of the bottom electrode 114 of the second device module 111. For example, a bump of conductive material 129 (e.g., more conductive adhesive) may be placed on the thin conducting layer 128 at a location aligned with the exposed portion of the bottom electrode 114. The bump of conductive material 129 is sufficiently tall as to make contact with the exposed portion of the bottom electrode 114 when the second device module 111 is attached to the carrier substrate. The dimensions of the notches 117, 119 may be chosen so that there is essentially no possibility that the thin conducting layer 128 will make undesired contact with the back plane 118 of the second device module 111. For example, the edge of the bottom electrode 114 may be cut back with respect to the insulating layer 116 by an amount of cutback $CB_1$ of about 400 microns. The back plane 118 may be cut back with respect to the insulating layer 116 by an amount $CB_2$ that is significantly larger than $CB_1$. Optionally, the backside conductor or backplane 108 may be extended as shown by phantom section 131 to extend to be positioned below the bottom electrode 114 of an adjacent cell. In one embodiment, the two layers 131 and 114 may be connected together by a variety of methods such as but not limited to ultrasonic welding, laser welding, soldering, or other techniques to create an electrical connection. The layer 131 may be bent or shaped to better engage the section 114. Some embodiments may have holes, openings, or cutaways in the layer 131 to facilitate attachment.

The device layers 102, 112 are preferably of a type that can be manufactured on a large scale, e.g., in a roll-to-roll processing system. There are a large number of different types of device architectures that may be used in the device layers 102, 112. By way of example, and without loss of generality, the inset in FIG. 1A shows the structure of a CIGS active layer 107 and associated layers in the device layer 102. By way of example, the active layer 107 may include an absorber layer 130 based on materials containing elements of groups IB, IIIA and VIA. Preferably, the absorber layer 130 includes copper (Cu) as the group IB, Gallium (Ga) and/or Indium (In) and/or Aluminum as group IIIA elements and Selenium (Se) and/or Sulfur (S) as group VIA elements. Examples of such materials (sometimes referred to as CIGS materials) are described in U.S. Pat. No. 6,268,014, issued to Eberspacher et al on Jul. 31, 2001, and US Patent Application Publication No. US 2004-0219730 A1 to Bulent Basol, published Nov. 4, 2004, both of which are incorporated herein by reference. A window layer 132 is typically used as a junction partner between the absorber layer 130 and the transparent conducting layer 109. By way of example, the window layer 132 may include cadmium sulfide (CdS), zinc sulfide (ZnS), or zinc selenide (ZnSe) or some combination of two or more of these. Layers of these materials may be deposited, e.g., by chemical bath deposition or chemical surface deposition, to a thickness of about 50 nm to about 100 nm. A contact layer 134 of a metal different from the bottom electrode may be disposed between the bottom electrode 104 and the absorber layer 130 to inhibit diffusion of metal from the bottom electrode 104. For example, if the bottom electrode 104 is made of aluminum, the contact layer 134 may be a layer of molybdenum.

Although CIGS solar cells are described for the purposes of example, those of skill in the art will recognize that embodiments of the series interconnection technique can be applied to almost any type of solar cell architecture. Examples of such solar cells include, but are not limited to: cells based on amorphous silicon, Graetzel cell architecture (in which an optically transparent film comprised of titanium dioxide particles a few nanometers in size is coated with a monolayer of charge transfer dye to sensitize the film for light harvesting), a nanostructured layer having an inorganic porous semiconductor template with pores filled by an organic semiconductor material (see e.g., US Patent Application Publication US 2005-0121068 A1, which is incorporated herein by reference), a polymer/blend cell architecture, organic dyes, and/or $C_{60}$ molecules, and/or other small molecules, micro-crystalline silicon cell architecture, randomly placed nanorods and/or tetrapods of inorganic materials dispersed in an organic matrix, quantum dot-based cells, or combinations of the above. Furthermore, embodiments of the series interconnection technique described herein can be used with optoelectronic devices other than solar cells.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, with any of the above embodiments, carbon nanotubes may be used alone or in combination with an adjacent layer to form the transparent electrode and minimize shunting. It should be understood that the embodiments herein may be suitable for addressing web-like conductors made of other materials such as noble metal based or noble metal nanoarchitected webs or meshes (or their alloys) and are not limited to the carbon nanotubes. It should be understood that the carbon nanotubes layer may be deposited in one step and a binder applied in a second step. Optionally, the binder and web-like conductors are applied simultaneously. In some embodiments, the web-like conductors are suspended in dispersion with a layer of material (such as for the junction partner or the transparent conductor) and solution deposited simultaneously. Some embodiments may have a layer of web-like transparent conductor and then a layer of ZnO on top. Optionally, the positions may be reversed with the ZnO on the bottom and the web-like transparent conductor on top. As mentioned, the use of ZnO is purely exemplary and other transparent materials may be used.

Furthermore, those of skill in the art will recognize that any of the embodiments of the present invention can be applied to almost any type of solar cell material and/or architecture. For example, the absorber layer in the solar cell may be an absorber layer comprised of silicon, amorphous silicon, organic oligomers or polymers (for organic solar cells), bi-layers or interpenetrating layers or inorganic and organic materials (for hybrid organic/inorganic solar cells), dye-sensitized titania nanoparticles in a liquid or gel-based electrolyte (for Graetzel cells in which an optically transparent film comprised of titanium dioxide particles a few nanometers in size is coated with a monolayer of charge transfer dye to sensitize the film for light harvesting), copper-indium-gallium-selenium (for CIGS solar cells), CdSe, CdTe, Cu(In,Ga)(S,Se)$_2$, Cu(In,Ga,Al)(S,Se,Te)$_2$, and/or combinations of the above, where the active materials are present in any of several forms including but not limited to bulk materials, micro-particles, nano-particles, or quantum dots. The CIGS cells may be formed by vacuum or non-vacuum processes. The processes may be one stage, two stage, or multi-stage CIGS processing techniques. Optionally, some embodiments may be from a group IB-IIB-IVA-VIA compound absorber layer. Additionally, other possible absorber layers may be based on amorphous silicon (doped or undoped), a nanostructured layer having an inorganic porous semiconductor template with pores filled by an organic semiconductor material (see e.g., US Patent Application Publication US 2005-0121068 A1, which is incorporated herein by reference), a polymer/blend cell architecture, organic dyes, and/or C$_{60}$ molecules, and/or other small molecules, micro-crystalline silicon cell architecture, randomly placed nanorods and/or tetrapods of inorganic materials dispersed in an organic matrix, quantum dot-based cells, or combinations of the above. Many of these types of cells can be fabricated on flexible substrates.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a thickness range of about 1 nm to about 200 nm should be interpreted to include not only the explicitly recited limits of about 1 nm and about 200 nm, but also to include individual sizes such as but not limited to 2 nm, 3 nm, 4 nm, and sub-ranges such as 10 nm to 50 nm, 20 nm to 100 nm, etc. . . .

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited. For example, U.S. Patent applications Ser. Nos. 60/909,357 filed Mar. 30, 2007 and 60/913,260 filed Apr. 20, 2007 are fully incorporated herein by reference for all purposes.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method comprising:
   forming a photovoltaic active layer;
   depositing a transparent material layer on a sacrificial layer, wherein the transparent material layer is loaded with conductive nanopowder or nanoparticles, wherein the nanopowder or nanoparticle comprises a metal or alloy having a melting temperature about 250 C or less;
   sintering the nanopowder or nanoparticles in the transparent material layer on the sacrificial layer; and
   depositing the transparent material layer onto the photovoltaic active layer by transferring the transparent material layer from the sacrificial layer to the photovoltaic active layer;
   wherein the transparent material layer comprises block co-polymer, and wherein
   conductive material is deposited into pores of the block co-polymer.

2. The method of claim 1 wherein the transparent material layer comprises a web-like layer of conductive material comprising of a plurality of metallic nanowires.

3. The method of claim 1 wherein the photovoltaic active layer comprises an absorber layer comprises of a group IB-IIIA-VIA material.

4. The method of claim 1 wherein the transparent material layer further comprises a second metal material having a melting temperature above 150 C, wherein sintering the two materials forms a conductive alloy, solid-solution or line-compound.

5. The method of claim 4 wherein the nanopowder or nanoparticle comprises Ga, Cs, Rb, or Hg, which is combined with high-melting materials selected from the group consisting of Al, Cu, Fe, Ni.

6. The method of claim 5 comprising forming one of the following:
   a Al-Ga solid-solution or Cu-Ga solid-solution or line-compound.

7. A method comprising:
   forming a photovoltaic active layer;
   depositing a transparent material layer on a sacrificial layer, wherein the transparent material layer is loaded with particles comprising a low-melting temperature material selected from the group consisting of: Ga, In, Cs, Rb, Hg, Sn-Bi, Pb-Sn, Zn-Sn, Ag-Sn, and Al-Sn;
   sintering the nanopowder or nanoparticles in the transparent material layer on the sacrificial layer; and
   depositing the transparent material layer onto the photovoltaic active layer by transferring the transparent material layer from the sacrificial layer to the photovoltaic active layer;

wherein the transparent material layer comprises block co-polymer, and wherein conductive material is deposited into pores of the block co-polymer.

8. A method comprising:

forming a photovoltaic active layer;

forming a transparent material layer on a sacrificial layer, wherein the transparent material layer contains electrically conductive nanopowder or nanoparticles;

sintering the nanopowder or nanoparticles in the transparent material layer on the sacrificial layer; and depositing the transparent material layer onto the photovoltaic active layer by transferring the transparent material layer from the sacrificial layer to the photovoltaic active layer;

wherein the transparent material layer comprises block co-polymer, and wherein conductive material is deposited into pores of the block co-polymer.

9. The method of claim 8 wherein transferring occurs by an adhesion and release technique.

10. The method of claim 8 wherein the particles comprise particles with melting temperature above 150 C.

11. The method of claim 8 wherein the particles comprise conductive oxide particles.

12. The method of claim 8 wherein the sacrificial layer comprises aluminum foil.

13. The method of claim 8 wherein the transparent material layer includes one or more of the following: conductive oxides, conductive nitrides, conjugated molecules, conjugated polymers, fullerenes, TCO particles, doped semiconductor particles, Ga-AMALGAMS, AZO, GZO, BZO, or ITO.

* * * * *